United States Patent
Drobny et al.

(10) Patent No.: US 7,388,271 B2
(45) Date of Patent: Jun. 17, 2008

(54) SCHOTTKY DIODE WITH MINIMAL VERTICAL CURRENT FLOW

(75) Inventors: Vladimir Drobny, Tucson, AZ (US); Derek Robinson, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/174,190

(22) Filed: Jul. 1, 2005

(65) Prior Publication Data
US 2007/0001193 A1 Jan. 4, 2007

(51) Int. Cl.
*H01L 27/095* (2006.01)
*H01L 29/47* (2006.01)
*H01L 29/812* (2006.01)
*H01L 31/07* (2006.01)
*H01L 31/108* (2006.01)

(52) U.S. Cl. ............... 257/475; 257/476; 257/485; 257/E29.148; 257/E29.338

(58) Field of Classification Search ........... 257/475, 257/476, 485, E29.148, E29.338
See application file for complete search history.

(56) References Cited

U.S. PATENT DOCUMENTS 4,669,180 A * 6/1987 Thomas et al. ............ 438/384

2006/0065891 A1* 3/2006 McCormack et al. ......... 257/50
2006/0125039 A1* 6/2006 Levin et al. ................ 257/471
2006/0231875 A1* 10/2006 Patrick et al. ............. 257/292

* cited by examiner

Primary Examiner—Ngan Ngo
(74) Attorney, Agent, or Firm—Frederick J. Telecky, Jr.; Wade J. Brady, III (57) ABSTRACT

A method of forming a rectifying diode. The method comprises providing a first semiconductor region of a first conductivity type and having a first dopant concentration and forming a second semiconductor region in the first semiconductor region. The second semiconductor region has the first conductivity type and having a second dopant concentration greater than the first dopant concentration. The method also comprises forming a conductive contact to the first semiconductor region and forming a conductive contact to the second semiconductor region. The rectifying diode comprises a current path, and the path comprises: (i) the conductive contact to the first semiconductor region; (ii) the first semiconductor region; (iii) the second semiconductor region; and (iv) the conductive contact to the second semiconductor region. The second semiconductor region does not extend to a layer buried relative to the first semiconductor region.

15 Claims, 6 Drawing Sheets

SCHOTTKY DIODE WITH MINIMAL VERTICAL CURRENT FLOW

CROSS-REFERENCES TO RELATED APPLICATIONS

This application is related to U.S. patent application Ser. No. 11/173,695, entitled "Spike Implanted Schottky Diode," filed on the same date as the present application, and hereby incorporated herein by reference.

STATEMENT REGARDING FEDERALLY SPONSORED RESEARCH OR DEVELOPMENT

Not Applicable.

BACKGROUND OF THE INVENTION

The present embodiments relate to semiconductor circuits and are more particularly directed to a Schottky diode with minimal vertical current flow.

Semiconductor devices are prevalent in all aspects of electronic circuits, and such circuits use numerous types of elements including transistors. Due to the dominance of transistors in many designs, then circuit method flows are often developed toward constructing the transistors. However, other circuit elements are preferably implemented as part of the same steps as the transistor method flow, or in a less desirable case in some instances an additional step or steps to the transistor method flow are required to also construct other types of circuit elements.

Consistent with the above, another known semiconductor circuit element is a Schottky diode. A Schottky diode typically includes a metal to lightly-doped semiconductor interface, where this interface is known to have rectifying characteristics. In many applications, the semiconductor portion at this interface is created using an N type material because the resulting diode has a larger barrier height than if a P type semiconductor is used, and in many applications the larger barrier height is desirable. However, in some applications it may be desirable to have the lower barrier height as provided by a P type material included in a Schottky diode. For example, one such application is the implementation of radio frequency identification ("RFID") devices. A passive RFID tag device, as known in that art, is a device that has no internal energy source. It receives a radio frequency ("RF") signal and provides a corresponding current in response to that signal. In some applications, the RFID device will receive a relatively small RF signal and, hence, in these applications a low-barrier Schottky diode is desirable so as to be operable to sufficiently detect the small RF signal. In other more general applications, a disadvantage, however, may arise in low-barrier Schottky diodes in that there may be a dominance of series resistance that may cause a relatively large amount of current flow at low voltage and such current also will be affected by the series resistance. In these latter cases, therefore, the use of an N type semiconductor Schottky diode may be preferred. In any event, therefore, one skilled in the art will appreciate applications for either N type or P type semiconductor Schottky diodes.

Figure 1A:
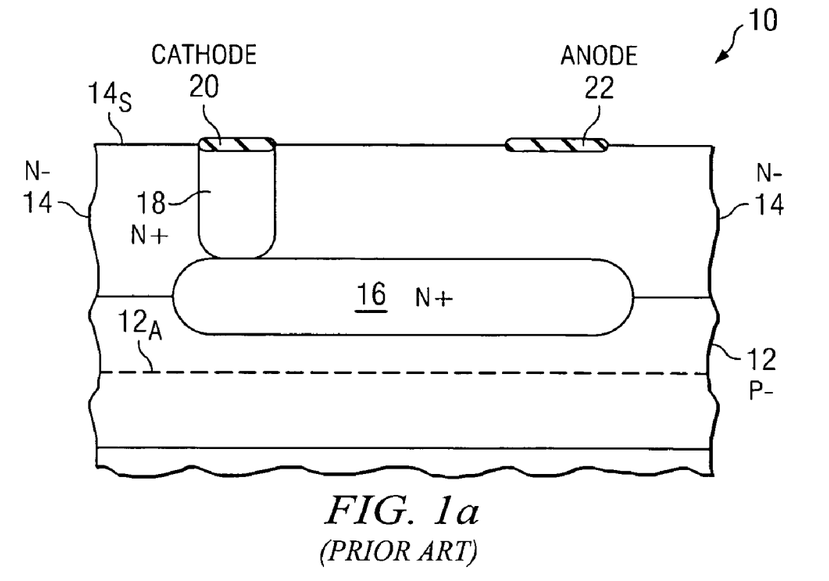
FIG. 1a illustrates a cross-sectional view of a prior art diode 10.
Figure 1B:
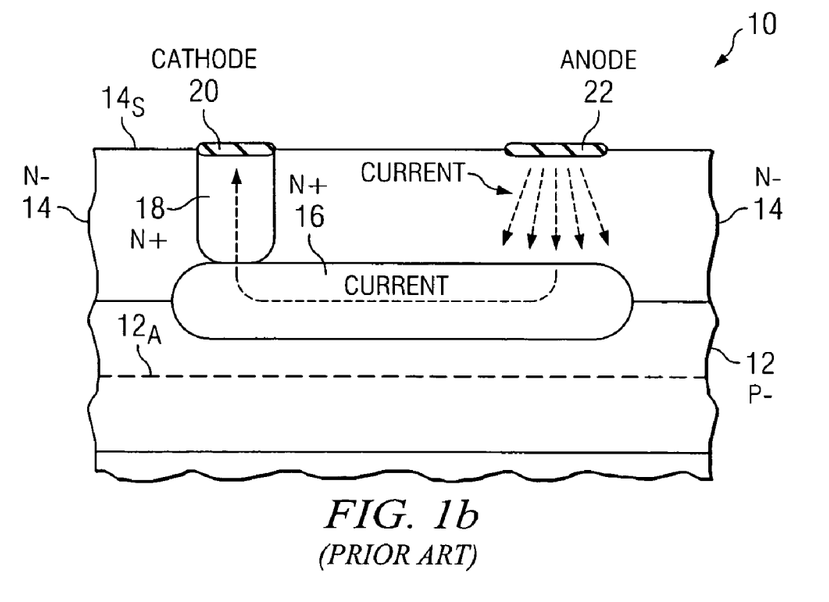
FIG. 1b illustrates the cross-sectional view of the prior art diode 10 with an indication of the current flow during operation.

By way of further background, semiconductor Schottky diodes have been constructed and used in the prior art and in the general form of the cross-sectional illustration of FIG. 1a, which depicts a diode 10. Diode 10 is formed in connection with a semiconductor substrate 12, which in the example of FIG. 1a is a P type semiconductor material and which is lightly-doped, as shown by the conventional designation of "P−" in FIG. 1 for such type and level of doping. For sake of explanation here and later contrast to the preferred embodiments, the majority axis of substrate is shown by way of a dashed line and indicated as $12_A$ and in the illustration is generally horizontal. A layer of N type material is formed such as an N well 14 generally above or as part of the top portion of substrate 12, and it is lightly-doped as shown by the conventional designation of "N−" in FIG. 1 for such type and level of doping. Separating at least a portion of substrate 12 from N well 14 is a buried layer 16, which is N type and heavily-doped as shown by the conventional designation of "N+" in FIG. 1 for such type and level of doping. Note that the descriptor "buried layer" is just one of various terms used in the art, so as to describe a portion of semiconductor material that is beneath the surface of an overlying layer; thus, in the example of FIG. 1, buried layer 16 is beneath the surface $14_S$ of the overlying layer of N well 14. A buried layer such as buried layer 16 may be formed in various fashions, such as by forming it in substrate 12 prior to forming an overlying layer or, alternatively, by using a high energy implantation process that is able to penetrate surface $14_S$ and form the layer deeper than that surface so that some unaffected and different doped level of material (e.g. N type for well 14) is left above the buried layer implant and without the dopant concentration of that buried layer. A heavily-doped conductive region 18 is formed from surface $14_S$ down to, and of the same conductivity type as, buried layer 16; region 18 also may be referred to by various terms such as a sinker and thus hereinafter this region is referred to as sinker 18. In the present example where buried layer 16 is N+ material, then so is sinker 18. Lastly, diode 10 includes two metal-silicide regions 20 and 22. Metal-silicide region 20 is formed over and in contact with sinker 18, and metal-silcide region 22 is formed along surface $14_S$. Note that diode 10 may include other regions or portions, but they are not illustrated so as to simplify the illustration while permitting a focus on various noteworthy aspects.

The operability of diode 10 is now discussed in connection with FIG. 1b, which again depicts diode 10 but includes a few additional illustrated aspects. As introduced earlier, a metal to lightly-doped semiconductor interface provides rectifying characteristics; thus, in diode 10, the interface of metal-silicide region 22 to N well 14 creates such characteristics. Thus, in operation, this interface performs akin to a PN junction, so a positive forward bias voltage may be applied to metal-silcide region 22 relative to metal silicide region 20. With this bias, current flows from metal-silicide region 22 to N well 14, as shown in FIG. 1b by the generally vertical dashed arrows in N well 14. Thus, with respect to this current flow, it generally is vertical and not parallel to the lateral (or horizontal) majority axis $12_A$ of substrate 12. Also in this regard, therefore, metal-silicide region 22 operates as the diode anode, providing the direction of inward current flow. Further, the relatively lower potential at metal-silicide region 20 is connected through an ohmic connection to the relatively high doping of sinker 18, which further connects that potential to buried layer 16; thus, the current flow continues from N well 14 through buried layer 16 and sinker 18 toward metal silcide region 20, thereby permitting the latter to be referred to as the diode cathode. Given the preceding, it is observed now, and by way of contrast to the preferred embodiments detailed later, that the prior art diode 10 includes a considerable vertical component in the direction of its current flow. This vertical component occurs due to the inclusion and use of buried layer 16 as part of the diode's conductive path, whereby vertical current flow is facilitated both through well 14 to buried layer 16 and from buried layer 16 through sinker 18.

While diode 10 has proven usable and beneficial in various implementations, the present inventors have recognized that it may have certain drawbacks in some circuits. For example, some method flows may not include a buried layer of the configuration as shown in FIGS. 1a and 1b. For example, there may be no buried layer or, alternatively, the buried layer may be of a relatively low doping so as not to provide a low resistance connection to the overlying region (e.g., N well 14). Thus, in these examples, including an appropriate buried layer in order to support a diode would require additional fabrication steps, and often such additions are either undesirable or infeasible due to considerations of time, cost, and still other considerations.

In view of the above, there arises a need to address the drawbacks of the prior art, as is achieved by the preferred embodiments described below.

BRIEF SUMMARY OF THE INVENTION

In the preferred embodiment, there is a method of forming a rectifying diode. The method comprises providing a first semiconductor region of a first conductivity type and having a first dopant concentration and forming a second semiconductor region in the first semiconductor region. The second semiconductor region has the first conductivity type and having a second dopant concentration greater than the first dopant concentration. The method also comprises forming a conductive contact to the first semiconductor region and forming a conductive contact to the second semiconductor region. The rectifying diode comprises a current path, and the path comprises: (i) the conductive contact to the first semiconductor region; (ii) the first semiconductor region; (iii) the second semiconductor region; and (iv) the conductive contact to the second semiconductor region. The second semiconductor region does not extend to a layer buried relative to the first semiconductor region.

Other aspects are also disclosed and claimed.

BRIEF DESCRIPTION OF THE SEVERAL VIEWS OF THE DRAWING

FIG. 5b illustrates a plan view of the interdigitated Schottky diode of FIG. 5a.

DETAILED DESCRIPTION OF THE INVENTION

FIGS. 1a and 1b were described above in the Background Of The Invention section of this document and the reader is assumed familiar with the principles of that discussion.

Figure 2A:
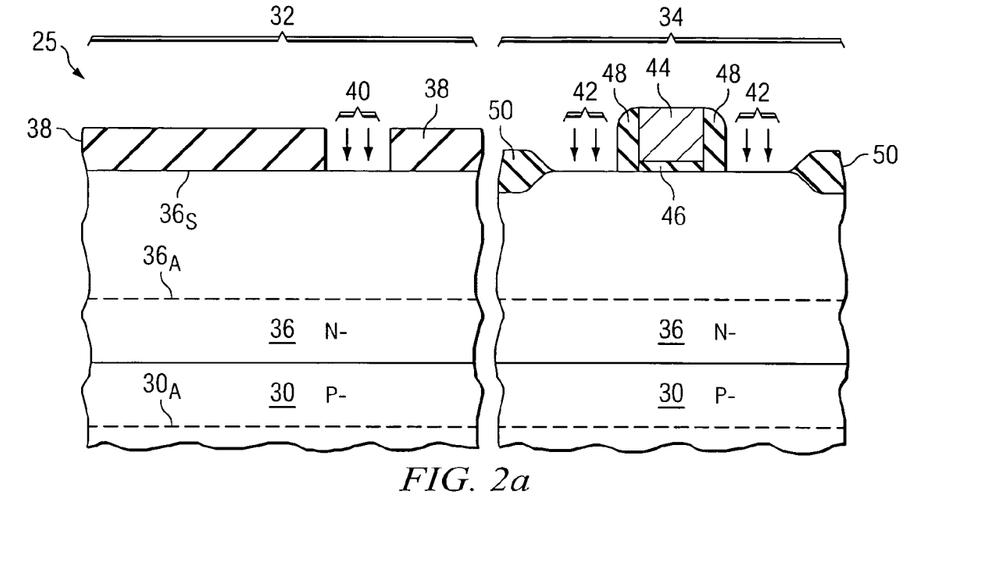
FIG. 2a illustrates a cross-sectional view of two active regions of a semiconductor structure after certain method flow steps according to the preferred embodiments.
Figure 2B:
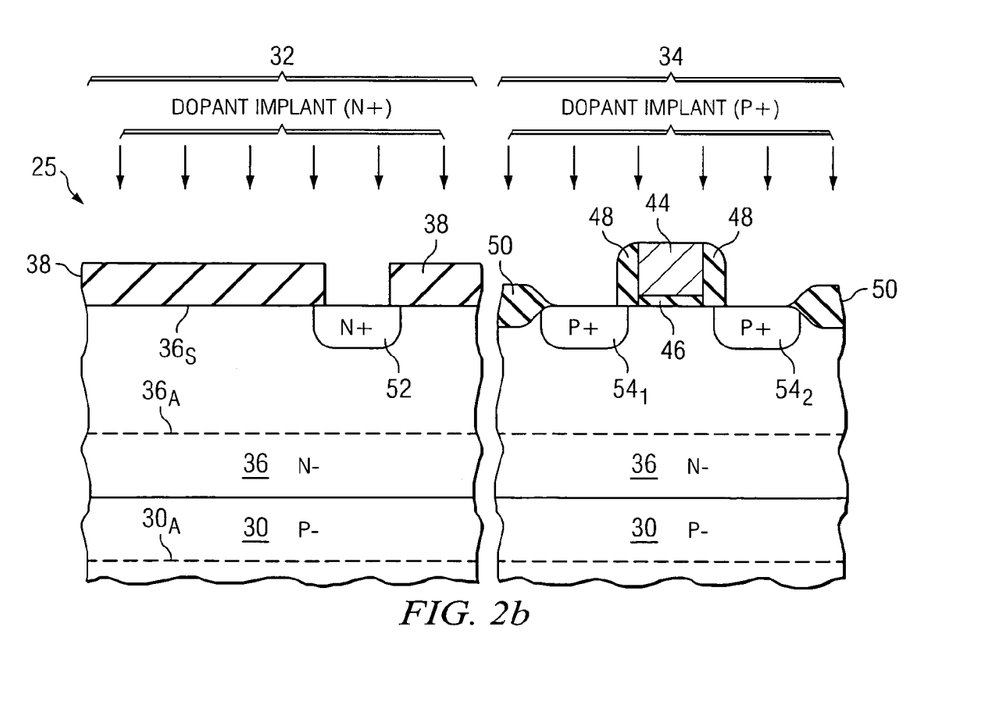
FIG. 2b illustrates a cross-sectional view of FIG. 2a subjected to a dopant implant.

FIGS. 2a through 2e illustrate a cross-sectional view of a semiconductor structure 25 according to the preferred embodiments. For sake of example, note that structure 25 includes a region 30 that may be a substrate, or alternatively, region 30 may be an isolated well that is disposed over a separate and underlying substrate that is not specifically shown in the Figures. In the present example, region 30 is a lightly-doped P type material, shown therefore with a "P–" designation. A light doping preferably has a doping profile concentration on the order of $10^{16}/cm^3$ or less. The majority axis of region 30 is shown by way of a dashed line as $30_A$ and in the illustration is generally lateral or horizontal. The direction of axis $30_A$ provides a reference direction and dimension for sake of discussion later in terms of the operation and flow of current for a Schottky diode that is formed in an active region 32 (sometimes referred to as a device region) of structure 25, as will be described in the remainder of this document. By way of further introduction, FIG. 3 illustrates a flowchart of the method 100 steps for forming the stated Schottky diode in active region 32 and is referred to concurrently with the following discussion of FIGS. 2a through 2e. Moreover, for purposes of demonstrating the formation of the Schottky diode at a same time as other devices and as part of the method flow of such other devices, another active region 34 is shown in relation to structure 25, and by way of example a transistor will be formed in active region 34. Lastly, for the method steps and following illustrations, a semiconductor layer 36 as may be formed as a well by way of example is formed above region 30, and region 30 has a majority axis $36_A$ that is parallel to axis $30_A$. In the present example, semiconductor layer 36 is a lightly-doped N type material, shown therefore with an "N–" designation.

Looking then to FIG. 3, method 100 begins with a step 102 which follows various front end steps that may be used to form various structural components of transistors with respect to substrate 25, where by way of example such components are shown in active region 34 as discussed below. Looking first to step 102, a mask is formed and/or otherwise semiconductor areas are exposed or provided into which a source/drain implant may occur. In FIG. 2a and in active region 32 in this regard, a mask is formed by applying a photoresist ("PR") layer 38 to surface $36_S$ and that layer is thereafter etched to form an opening 40 through layer 38. In FIG. 2a and in active region 34 in this regard, areas 42 are exposed with respect to various structures previously formed in connection with creating a transistor. These previously-formed structures include a gate 44 separated by a gate insulator 46 from layer 36. These structures further include insulating sidewalls 48 formed along the sidewalls of gate 44, and note that the gate structure thus described is isolated by isolating regions 50. Thus, and as shown below, areas 42 constitute the exposed upper surface $36_S$ of layer 36 as between an insulating sidewall 48 and a respective one of isolating regions 50, and the upper surface of gate 44 may be exposed for the implant as well. Given these various structures, method 100 then continues from step 102 to step 104.

In step 104, one or more separate high-concentration dopant implant operations are individually performed in a CMOS example, possibly a single implant in an application other than CMOS, depending on the desired conductivity types of the transistors at issue as well as the formation of a structure in active region 32 to be used later as part of the conductive path of a Schottky diode. For the sake of simplifying the discussion and illustration, two different dopant conductivity types are shown in FIG. 2b. As an example, a first such dopant is implanted at one time into one of region 32 or 34 while masking off the other, while a second and complementary dopant is implanted at another time into the opposite one of region 32 or 34 while masking off the other. In the present example, wherein layer 36 is an N type region, then the dopant type of the implant into active region 32 is an N type dopant, that is, the dopant is of the same conductivity type as the layer into which the dopant is implanted. Moreover, with a goal of achieving the formation of very heavy doped regions (i.e., "N+") by the implant, the doping parameters are preferably set so as to achieve an implanted doping profile having a concentration on the order of $10^{19}$ to $10^{21}/cm^3$ or greater. Further, the implant is by way of a high-dose ion implantation of high dose of antimony, arsenic or phosphorus species to form NMOS regions that are typically referred to as source/drain regions because at the same time actual transistor source/drain regions may be formed. Further, were the present example an alternative embodiment that implements complementary conductivity type structures (i.e., substituting N for P and vice versa in active region 32), then the implanted ions may be of boron to form PMOS source/drain regions. In the present example, therefore, where layer 36 is N type, then antimony, arsenic or phosphorus may be used to form the resulting source/drain region(s) in active region 32. Particularly, a source/drain region 52 is formed in active region 32 by way of opening 40 (see FIG. 2a); as shown below, technically this region does not serve as either a source or drain with respect to a transistor, yet the source/drain terminology is maintained since it is formed using the same process and at the same time as may be source/drain regions elsewhere with respect to the same semiconductor layer 36. Further in this regard and also in step 104, a second implant may be performed and of an opposite conductivity type, which thereby forms source/drain regions $54_1$ and $54_2$ and of this opposite conductivity type (e.g., P type in this example). Thus, regions $54_1$ and $54_2$ are self-aligned in areas 42, that is, as between each respective gate insulator 48 and a respective isolating region 50. With these various structures, method 100 then continues from step 104 to step 106.

Figure 2C:
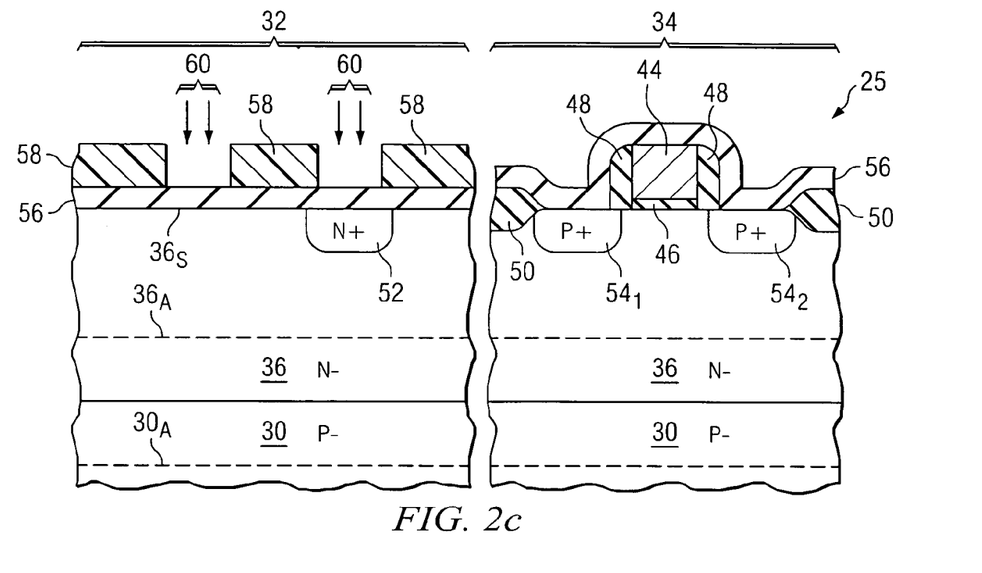
FIG. 2c illustrates a cross-sectional view of FIG. 2b following the removal of a mask, the formation of an insulating layer, and the formation of an additional mask.
Figure 3:
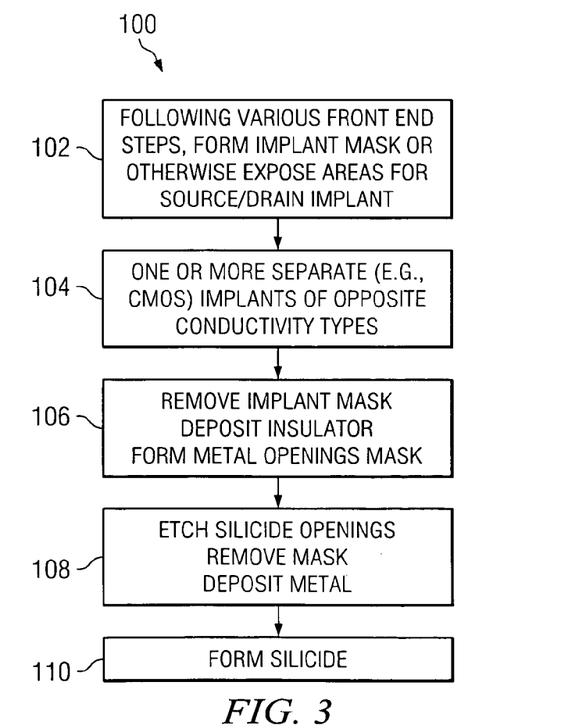
FIG. 3 illustrates a flow chart method 100 of forming the integrated circuit device of FIGS. 2a through 2e.

Step 106 of method 100 represents various different actions, yet they are accumulated in step 106 so as to correspond to the illustrations of FIG. 2c. Particularly, as part of step 106, the step 102 implant mask is removed, which recall was illustrated in the form of photoresist layer 38 in FIGS. 2a and 2b. Next and as another part of step 106, an insulating layer 56 is formed along surface $36_S$ of layer 36, such as by depositing an oxide, a nitride, or a combination of the two. Next and as yet another part of step 106, a metal openings mask is formed over layer 56, which in FIG. 2c is achieved by depositing a photoresist layer 58, followed by patterning steps comprising of exposure and development steps. More particularly, photoresist layer 58 is patterned to expose portions of insulating layer 56, that is, windows 60 are created through photoresist layer 58 for reasons demonstrated below. With these various structures, method 100 then continues from step 106 to step 108.

Figure 2D:
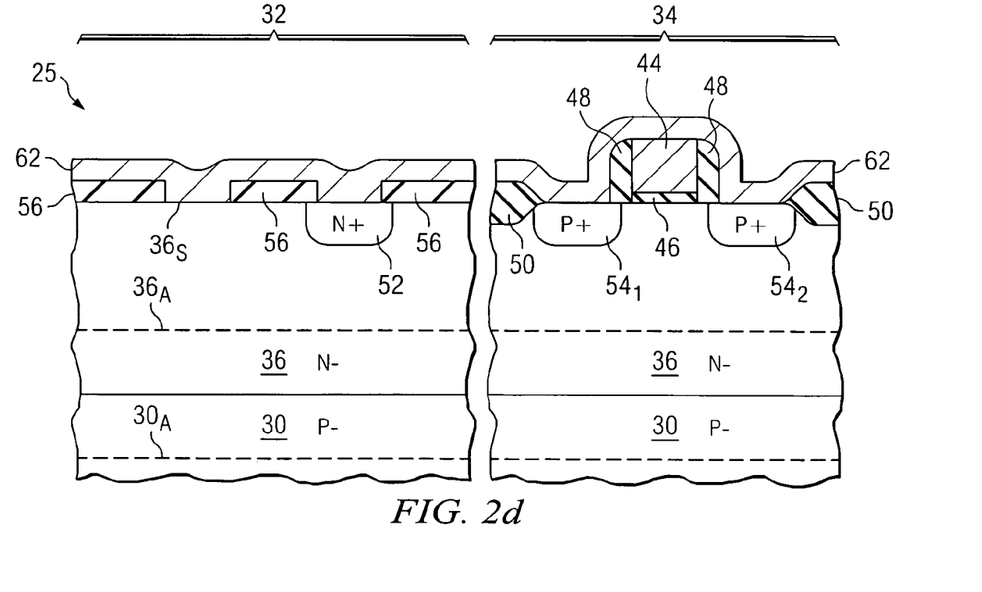
FIG. 2d illustrates a cross-sectional view of FIG. 2c following the etch of the insulating layer and the formation of a metal layer.

Step 108 of method 100 also represents various different actions that are accumulated in a single method step 108 so as to correspond to the illustrations of FIG. 2d. First, an etch selective to the exposed portions of insulating layer 56 is performed to thereby expose surface $36_S$ in the areas of the etch. Thus, surface $36_S$ is exposed in active region 32 at the locations provided by windows 60 (see FIG. 2c), and at the same time the entirety of insulating layer 56 is exposed and, hence removed from, active region 34. Next in step 108 and as shown in FIG. 2d, the step 106 mask is removed, which recall in the example of FIG. 2c was photoresist layer 58. Finally in step 108, a metal layer 62 is deposited over the entirety of the device, thereby covering the structures of active regions 32 and 34. Metal layer 62 is preferably cobalt, although it may be of various materials such as titanium or nickel, although these latter metals may provide a less desirable metal/semiconductor interface in certain applications. In any event, note with respect to active region 32, therefore, that metal layer 62 contacts an underlying semiconductor material in what were windows 60 of FIG. 2c, that is, given the etch through those windows and the consequent same-location removal of insulating layer 56, then metal layer 62 now contacts semiconductor material in those areas. Note also with respect to active region 34 that metal layer 62 contacts an underlying semiconductor material in locations where there was not an upper surface of insulating material; thus, metal layer 62 contacts the upper surface of both source/drain regions $54_1$ and $54_2$ as well as the upper surface of gate 44. With these various structures, method 100 then continues from step 108 to step 110.

Figure 2E:
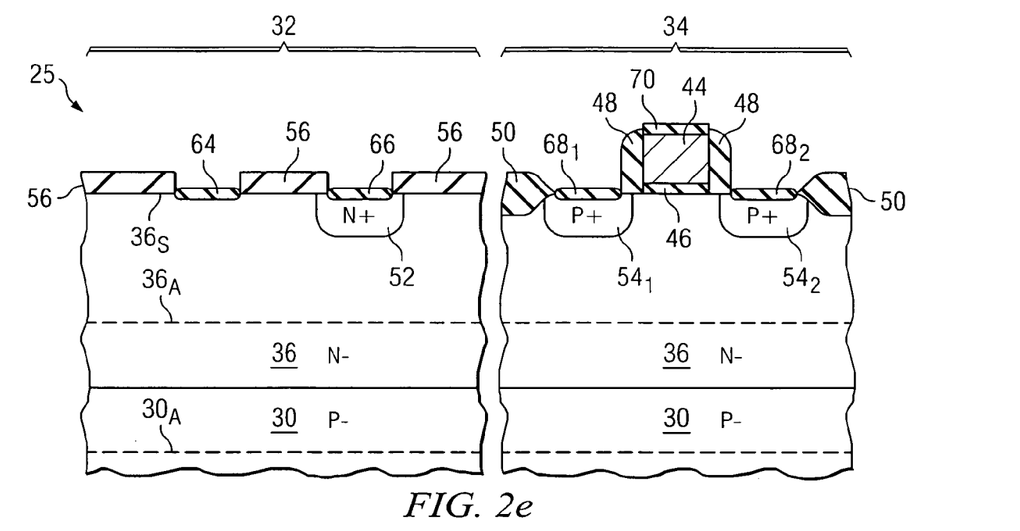
FIG. 2e illustrates a cross-sectional view of FIG. 2d following silicidization of the metal layer and removal of the non-silicided metal.

In step 110, a silicidation is achieved, preferably by subjecting the entire device of FIG. 2d to a heat anneal cycle, with the result shown in FIG. 2e. Specifically, as a result of the heat cycle, a silicide region forms only at locations where metal layer 62 contacts an exposed silicon or polysilicon region and not, therefore, over regions covered by an insulator (i.e., dielectric). As a result, silicide regions 64, 66, $68_1$, $68_2$, and 70 are formed, and note that each of these regions is self-aligned by way of consumption of the underlying exposed silicon or semiconductor. After the heat treatment any unreacted metal remaining from layer 62 is removed, preferably by an etch that is selective only to that metal (e.g., cobalt) and not the reacted metal (e.g., cobalt silicide), thereby leaving structure 25 in the form as shown in FIG. 2e. Lastly, while method 100 then concludes for sake of FIG. 3, note that various additional steps may be performed with respect to structure 25, such as other levels of metal and interconnect, where such other steps are ascertainable by one skilled in the art.

Figure 4:
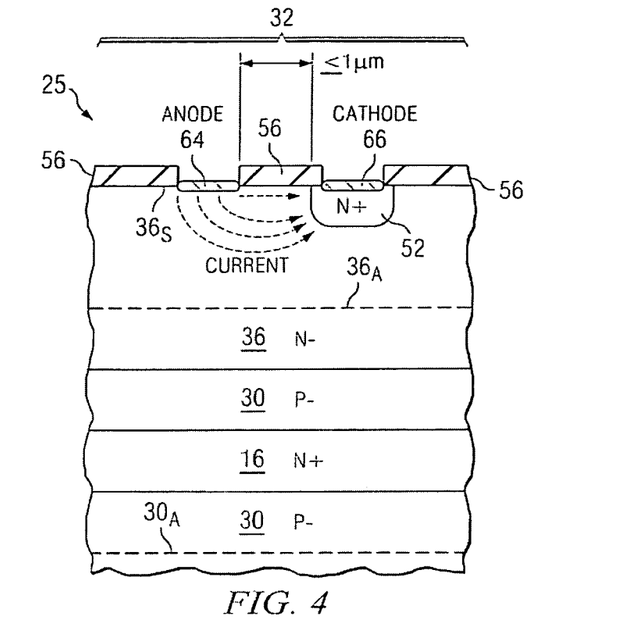
FIG. 4 illustrates a cross-sectional view of the Schottky diode of active region 32 from FIG. 2d and its operation.

Having described the construction of structure 25, attention is now directed to the operation of a Schottky diode per the preferred embodiments, which is effectively what has been constructed in active region 32 and, for sake of illustration, which is therefore repeated in operational form and in the cross-sectional view of FIG. 4. Here again, a metal to lightly-doped semiconductor interface is created, where in the example of FIG. 4 that is as between silicide region 64 and the lightly-doped N type layer 36 beneath it. Thus, in operation, this interface performs akin to a PN junction, so a positive forward bias voltage may be applied to metal-silcide region 64 relative to metal silcide region 66. With this bias, current flows from metal-silicide region 64 to layer 36, as shown in FIG. 4 by the generally lateral (or horizontal) dashed arrows in layer 36. Thus, with respect to this current flow, at least a majority of the current flow is parallel to majority axis $30_A$ and majority axis $36_A$. In other words, in FIG. 4 and unlike the prior art, there is not a large amount of current that is generally vertical and, thus, perpendicular to these majority axes, as was the case in the prior art where current flow is downward to a buried layer that has its own majority axis that is parallel to the substrate axis. Further, metal-silicide region 64 operates as the diode anode, providing the inward direction of current flow. Also, the relatively lower potential at metal-silicide region 66 is connected through an ohmic connection to the relatively high doping of source/drain region 52, which further connects that potential to layer 36; thus, the current flow continues from layer 36 laterally to source/drain region 52 and then to metal silicide region 66, thereby permitting the latter to be referred to as the diode cathode. Indeed, in the preferred embodiment, preferred diode operation is achieved when the distance between the closest edge of metal-silicide region 64 and source/drain region 52 is approximately one micron or less.

Given the preceding, it is observed now, and by way of contrast to the prior art, that the preferred embodiment Schottky diode of FIG. 4 includes a primarily lateral or horizontal component in the direction of its current flow, that is, one which is parallel to the major axis of the associated substrate that supports the device. Moreover, the current path consists of a first metal region (e.g., silicide), a lightly-doped semiconductor region of a first conductivity type, a heavily-doped region of the same first conductivity type that is isolated from or does not extend to a buried layer beneath the lightly-doped semiconductor region, and a second metal region (e.g., silicide). Thus, the preferred embodiment permits a design engineer or the like to take advantage of having a Schottky diode with very good DC and RF characteristics available, by way of example, on CMOS technology with no suitable buried layer available or in deep sub-micron technology (e.g., gate width of 0.25 micron or less). If there is no buried layer with the correct polarity of doping in a given method flow where a Schottky diode is to be integrated, then a prior art diode such as in FIGS. 1a and 1b could not be fabricated at all or such a diode would have excessive series resistance. In contrast, the preferred embodiment diode may be implemented in these cases. Moreover, as has been shown, various of the same method flow steps used in contemporary processes for transistor fabrication may be used without necessitating additional steps into the flow and while still being able to construct the preferred embodiment diode. Accordingly, the preferred embodiment diode may be integrated into any submicron or CMOS technology, and possibly others as well, without adding processing costs and complexity to the technology which otherwise would be added if a buried layer and sinker contact were required to be added to those processes.

Figure 5A:
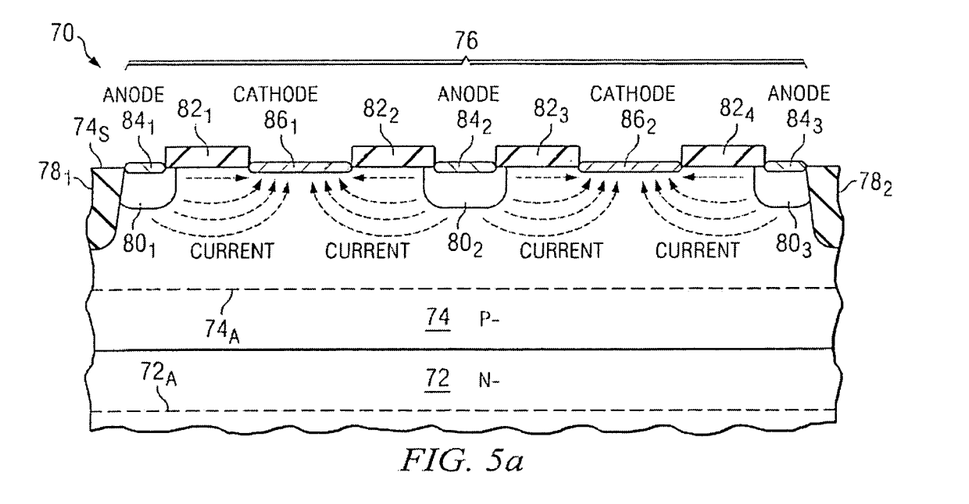
FIG. 5a illustrates a cross-sectional view of an interdigitated Schottky diode according to the preferred embodiments.
Figure 5B:
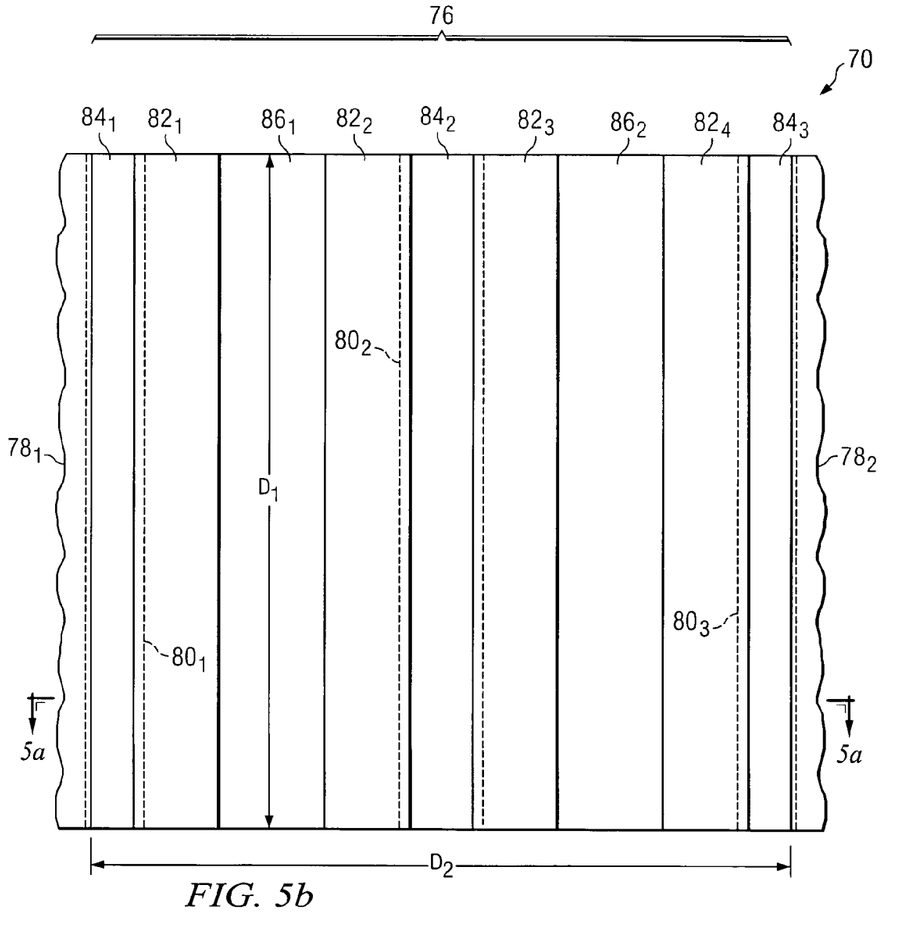

As an additional illustration of the present inventive scope, FIGS. 5a and 5b illustrate a cross-sectional and plan (i.e., top) view, respectively, of another Schottky diode 70 according to the preferred embodiments. In general, diode 70 may be constructed according to the steps of method 100 described above, with the appropriate formation of masks so as to create the various components illustrated in FIGS. 5a and 5b. Thus, the level of detail provided above is not restated here and the reader is assumed familiar with the principles of that discussion. Instead, the following focuses on various other aspects of diode 70, demonstrating an interdigitated layout that provides still additional benefits over the prior art.

Looking to FIG. 5a, it illustrates, in cross-sectional form, a region 72 that may be a substrate, or alternatively, region 72 may be an isolated well that is disposed over a separate and underlying substrate that is not specifically shown in the Figures. In the present example, region 72 is a lightly-doped N type material, shown therefore with an "N–" designation and with a majority axis $72_A$. A semiconductor layer 74 is formed, as a well by way of example, above region 72 and has a majority axis $74_A$ that is parallel to axis $72_A$. In the present example, semiconductor layer 74 is a lightly-doped P type material, shown therefore with a "P–" designation. Given the illustrated portions of region 72 and layer 74, an active region 76 is shown as between isolating regions $78_1$ and $78_2$, formed along surface $74_S$ of layer 74. Three heavily-doped P type source/drain regions $80_1$, $80_2$, and $80_3$ are formed in P type lightly-doped layer 74. An insulating layer is formed and etched, with the remaining portions of that layer shown as insulating pieces $82_1$, $82_2$, $82_3$, and $82_4$. Three silicide regions $84_1$, $84_2$, and $84_3$ are formed, each over and in electrical communication with a respective source/drain region $80_1$, $80_2$, or $80_3$, and two silicide regions $86_1$ and $86_2$ preferably from the same metal layer that forms silicide regions $84_x$, are formed over and in electrical communication with lightly-doped layer 74. Again, preferably the distance between the closest edge of a metal-silicide region $86_x$ and a source/drain region $80_x$ is approximately one micron or less.

Looking to FIG. 5b, it illustrates a plan view of various of the structures of diode 70 illustrated in connection with FIG. 5a, although for sake of simplifying the illustration the perimeter of each source drain region $80_x$ to the extent it is beyond its overlying silicide region $84_1$, $84_2$, or $84_3$ is shown by way of a dashed lines whereas in actuality such regions would not be visible from a true top perspective due to the adjacent insulating pieces $82_x$. The length of each silicide region $84_x$ or $86_x$ spans a distance $D_1$ shown in the y-dimension in FIG. 5b. Moreover, the overall width of diode 70 spans a distance $D_2$ shown in the x-dimension in FIG. 5b and that covers the active region 76 of the device (i.e., between isolating regions $78_1$ and $78_2$). In the preferred embodiment $D_1$ and $D_2$ are approximately the same (or within 90% of one another) so as to provide an overall structure that is approximately square in layout form. This preferred layout has been determined to provide beneficial operating performance for diode 70. For example, such an approach is optimal to reduce parasitic capacitance as compared to an approach wherein only a single silicide strip is used for an anode and a single silicide strip is used for a cathode.

In connection with both FIGS. 5a and 5b, attention is also directed to the interdigitated form of the layout and the beneficial operation resulting from it. Specifically, this form is defined in that in FIG. 5b, each combination of a silicide region $84_x$ and its underlying source/drain $80_x$ is separated by a silicide region $86_x$ from another like combination of a silicide region $84_x$ and its underlying source/drain $80_x$. For example, the combination of silicide region $84_1$ and its underlying source/drain $80_1$ is separated by silicide region $86_1$ from the combination of silicide region $84_2$ and its underlying source/drain $80_2$. As the other illustrated example, the combination of silcide region $84_2$ and its underlying source/drain $80_2$ is separated by silicide region $86_2$ from the combination of silicide region $84_3$ and its underlying source/drain $80_3$. Returning then to FIG. 5a, a benefit from this interdigitated layout is demonstrated. Specifically, FIG. 5a also illustrates the various current flow based on the structure of diode 70 by way of dashed arrows in layer 74. In this regard, each silicide region $84_x$ receives a positive bias with respect to each silicide region $86^x$, thereby providing the former as an anode and the latter as a cathode. Moreover, as may be seen by way of example with respect to silcide region $86_1$ acting as a cathode, it receives approximately one-half of its current flow from silicide region $84_1$ and the other one-half of its current flow from silicide region $84_2$. Similarly with respect to silicide region $86_2$ acting as a cathode, it receives approximately one-half of is current flow from silicide region $84_2$ and the other one-half of its current flow from silcide region $84_3$. As a result of these current flows, then the overall resistance of diode 70 is reduced as compared to an approach using a single non-interdigitated anode and cathode.

Also in connection with diode 70, note that it shares various benefits with the embodiment of FIG. 4. For example, at least a majority of the current flow is parallel to majority axis $72_A$ and majority axis $74_A$. In other words, in FIG. 5a and unlike the prior art, there is not a large amount of current that is generally vertical and, thus, perpendicular to these majority axes. As another example, each current path, either in the forward direction if from silicide to lightly-doped semiconductor or in the reverse direction if from silicide to heavily-doped semiconductor, consists of a first metal region (e.g., silicide), a lightly-doped semiconductor region of a first conductivity type, a heavily-doped region of the same first conductivity type that is isolated from or does not extend to a buried layer beneath the lightly-doped semiconductor region, and a second metal region (e.g., silicide). Thus, the additional benefits described above with respect to the FIG. 4 embodiment are also realized with the embodiment of FIGS. 5a and 5b.

From the above, it may be appreciated that the preferred embodiments provide a Schottky diode with minimal vertical current flow in that the diode conductive path does not include a buried layer or sinker thereto. Various alternatives have been provided according to preferred embodiments, and still others may be ascertained by one skilled in the art. Indeed, certain of the process parameters described herein may be adjusted by one skilled in the art, steps may be added or re-arranged in order, and substitutions in some materials also may be made. Further and as shown by examples, the preferred embodiment diode may be constructed with a P type or N type semiconductor material in the metal to lightly-doped semiconductor interface of the Schottky diode. Indeed, based on considerations such as barrier height, one or the other of these types may be selected, such as in a preferable implementation which may include the use of one or more Schottky diodes in a radio frequency identification ("RFID") tag device. Given the preceding, therefore, one skilled in the art should further appreciate that while the present embodiments have been described in detail, various substitutions, modifications or alterations could be made to the descriptions set forth above without departing from the inventive scope, as is defined by the following claims.

The invention claimed is:

1. A rectifying diode, comprising:
   first semiconductor region of a first conductivity type and having a first dopant concentration;
   a second semiconductor region in the first semiconductor region, the second semiconductor region having the first conductivity type and having a second dopant concentration greater than the first dopant concentration;
   a conductive contact in electrical contact with the first semiconductor region; and
   a conductive contact in electrical contact with the second semiconductor region;
   wherein the rectifying diode is operable to conduct along a current path, the current path comprising:
      the conductive contact to the first semiconductor region;
      the first semiconductor region;
      the second semiconductor region; and
      the conductive contact to the second semiconductor region; and
   wherein neither the first nor second semiconductor region extends to a layer buried relative to the first semiconductor region.

2. The diode of claim 1 wherein the first conductivity type is selected from a group consisting of P type and N type.

3. The diode of claim 2 wherein the diode is part of a CMOS integrated circuit with the first semiconductor region having the same doping concentration as a well of a CMOS transistor and the second semiconductor region having the same doping concentration as a source/drain of a CMOS transistor.

4. The diode of claim 2:
   wherein the first conductivity type is selected as P type; and
   wherein the diode is implemented in a radio frequency identification device.

5. The diode of claim 1 wherein the first dopant concentration is on the order of $10^{16}/cm^3$ or less.

6. The diode of claim 1 wherein the second dopant concentration, is on the order of $10^{19}$ to $10^{21}/cm^3$ or greater.

7. The diode of claim 1:
   wherein the first dopant concentration is on the order of $10^{16}/cm^3$ or less; and
   wherein the second dopant concentration is on the order of $10^{19}$ to $10^{21}/cm^3$ or greater.

8. The diode of claim 1 wherein a distance between a closest edge of the conductive contact to the first semiconductor region and a closest edge of the second semiconductor region is approximately one micron or less.

9. The diode of claim 1:
   wherein the second semiconductor region in the first semiconductor region comprises one of a plurality of highly-doped semiconductor regions in the first semiconductor region; and
   wherein at least some of the plurality of highly-doped semiconductor regions provide either a source or a drain to a transistor.

10. The diode of claim 1 wherein the conductive contact in electrical contact with the first semiconductor region and the conductive contact in electrical contact with the second semiconductor region comprise one of cobalt, titanium, and molybdenum.

11. The diode of claim 1:
    wherein the second semiconductor region comprises a plurality of semiconductor regions of the second dopant concentration;
    wherein the conductive contact in electrical contact with the first semiconductor region comprises one of a plurality of conductive contacts in electrical contact with the first semiconductor region; and
    wherein the conductive contact in electrical contact with the second semiconductor region comprises one of a plurality of conductive contacts, each in electrical communication with a respective one of the plurality of semiconductor regions of the second dopant concentration.

12. The diode of claim 11 wherein each contact in the plurality of conductive contacts in electrical contact with the first semiconductor region is interdigitated relative to each contact in the plurality of conductive contacts in electrical communication with a respective one of the plurality of semiconductor regions of the second dopant concentration.

13. The diode of claim 12:
- wherein each conductive contact in the plurality of conductive contacts in electrical contact with the first semiconductor region and each conductive contact in the plurality of conductive contacts in electrical communication with a respective one of the plurality of semiconductor regions of the second dopant concentration spans a first dimension;
- wherein a width that encompasses all of the plurality of conductive contacts in electrical contact with the first semiconductor region and every conductive contact in the plurality of conductive contacts in electrical communication with a respective one of the plurality of semiconductor regions of the second dopant concentration spans a second dimension; and
- wherein one of the first dimension and the second dimension is within ninety percent of the first dimension and the second dimension.

14. The diode of claim 1 wherein the diode is implemented in a radio frequency identification device.

15. A rectifying diode, comprising:
- a buried layer of a first conductivity type residing in a semiconductor body of a second conductivity type;
- a first semiconductor region residing above the buried layer in the semiconductor body, the first semiconductor region not contacting the buried layer, and having a first conductivity type and a first dopant concentration;
- a second semiconductor region in the first semiconductor region, the second semiconductor region having a first conductivity type and a second dopant concentration that is greater than the first dopant concentration;
- a conductive anode contact on the first semiconductor region; and
- a conductive cathode contact on the second semiconductor region.

* * * * *